(12) United States Patent
Uchida et al.

(10) Patent No.: US 12,490,946 B2
(45) Date of Patent: Dec. 9, 2025

(54) RADIATION DETECTOR AND RADIATION CT APPARATUS

(71) Applicant: CANON KABUSHIKI KAISHA, Tokyo (JP)

(72) Inventors: Tatsuro Uchida, Tokyo (JP); Tatsuya Saito, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 464 days.

(21) Appl. No.: 18/194,972

(22) Filed: Apr. 3, 2023

(65) Prior Publication Data

US 2024/0298982 A1 Sep. 12, 2024

(30) Foreign Application Priority Data

Mar. 7, 2023 (JP) ................................. 2023-034931

(51) Int. Cl.
*A61B 6/42* (2024.01)
*A61B 6/40* (2024.01)

(52) U.S. Cl.
CPC . *A61B 6/42* (2013.01); *A61B 6/40* (2013.01)

(58) Field of Classification Search
CPC .................................. A61B 6/42; A61B 6/40
See application file for complete search history.

(56) References Cited

U.S. PATENT DOCUMENTS

| 7,223,982 B1 | 5/2007 | Chen |
| 8,648,311 B2 | 2/2014 | Kobayashi |
| 2024/0302547 A1* | 9/2024 | Yamashita ........... A61B 6/4233 |

FOREIGN PATENT DOCUMENTS

| CN | 102364357 A | * | 2/2012 | ......... G01T 1/20181 |
| JP | 9-92806 A | | 4/1997 | |
| JP | 2002-158343 A | | 5/2002 | |
| JP | 2002-311145 A | | 10/2002 | |
| WO | WO 2017122514 A1 | * | 7/2017 | ........... H10F 39/809 |

* cited by examiner

*Primary Examiner* — Edwin C Gunberg
*Assistant Examiner* — Richard O Toohey
(74) *Attorney, Agent, or Firm* — VENABLE LLP (57) ABSTRACT

A radiation detector obtained by arranging a plurality of pixels on a semiconductor substrate configured to convert incident radiation into charges is provided. The plurality of pixels comprise a first pixel arranged along an outer edge of the semiconductor substrate and a second pixel arranged closer to a center of the semiconductor substrate than the first pixel. The first pixel comprises a plurality of first electrodes on a principal surface of the semiconductor substrate, the second pixel comprises a second electrode on the principal surface, and an area of the second electrode is larger than an area of each of the plurality of first electrodes. A plurality of capacitors configured to accumulate signals generated by the plurality of pixels are further comprised so that one capacitor is connected in correspondence with each of the plurality of first electrodes and the second electrode.

20 Claims, 7 Drawing Sheets

RADIATION DETECTOR AND RADIATION CT APPARATUS

BACKGROUND OF THE INVENTION

Field of the Invention

The present invention relates to a radiation detector and a radiation CT apparatus.

Description of the Related Art

There is known that a semiconductor substrate which converts incident radiation into charges is used for a radiation detector. U.S. Pat. No. 7,223,982 describes a radiation detector that suppresses deterioration in image quality when the charge collection efficiency decreases due to spreading of an electric field in an end portion of a semiconductor substrate.

In the end portion of the semiconductor substrate, defects may occur due to machining when cutting out the semiconductor substrate, thereby decreasing a carrier transport property. In the end portion of the semiconductor substrate, it is necessary to arrange electrodes in consideration of not only spreading of the electric field but also the decrease in the carrier transport property.

Some embodiments of the present invention provide a technique advantageous in suppressing the influence of a decrease in a carrier transport property in an end portion of a semiconductor substrate.

SUMMARY OF THE INVENTION

According to some embodiments, a radiation detector obtained by arranging a plurality of pixels on a semiconductor substrate configured to convert incident radiation into charges, wherein the plurality of pixels comprise a first pixel arranged along an outer edge of the semiconductor substrate and a second pixel arranged closer to a center of the semiconductor substrate than the first pixel, the first pixel comprises a plurality of first electrodes on one principal surface out of two principal surfaces of the semiconductor substrate, the second pixel comprises a second electrode on the one principal surface, an area of the second electrode is larger than an area of each of the plurality of first electrodes, and a plurality of capacitors configured to accumulate signals generated by the plurality of pixels are further comprised so that one capacitor is connected in correspondence with each of the plurality of first electrodes and the second electrode, is provided.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Radiation according to the present invention can include not only α-rays, β-rays, and γ-rays that are beams generated by particles (including photons) emitted by radioactive decay but also beams having equal or more energy, for example, X-rays, particle rays, and cosmic rays.

Figure 1:
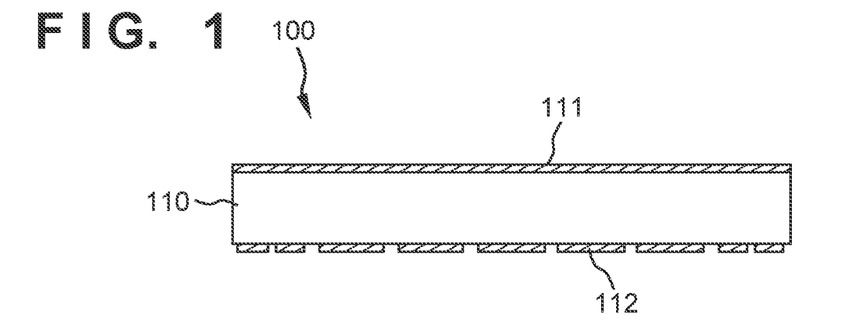
FIG. 1 is a view showing an example of the arrangement of a radiation detector according to an embodiment.

A radiation detector according to an embodiment of the present invention will be described with reference to FIGS. 1 to 10. FIG. 1 is a view showing an example of the arrangement of a radiation detector 100 according to this embodiment. In the radiation detector 100, a plurality of pixels are arranged on a semiconductor substrate 110 that converts incident radiation into charges. For the semiconductor substrate 110, a semiconductor single crystal substrate of a cadmium zinc telluride, cadmium telluride, or the like that directly converts incident radiation into charges is used. Note that this embodiment will mainly explain cadmium zinc telluride (CdZnTe) and cadmium telluride (CdTe) but the present invention is not limited to this and can be applied to a semiconductor single crystal substrate that can directly detect radiation such as X-rays. For example, this embodiment can be applied to a semiconductor single crystal substrate of lead iodide ($PbI_2$), mercury iodide ($HgI_2$), bismuth iodide ($BiI_3$), thallium bromide (TlBr), or the like. A plurality of electrodes 112 are arranged on one of two principal surfaces of the semiconductor substrate 110, and an electrode 111 is arranged on the other principal surface. The electrode 111 may be integrated, as shown in FIG. 1. However, the present invention is not limited to this and the electrode 111 may be divided into a plurality of electrodes.

Figure 2:
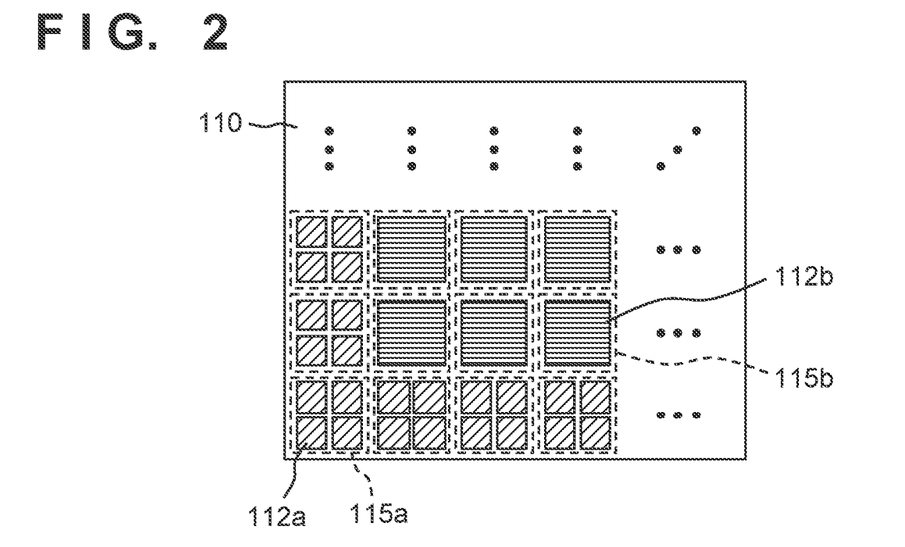
FIG. 2 is a view showing an example of the arrangement of electrodes arranged on a semiconductor substrate of the radiation detector shown in FIG. 1.

FIG. 2 is a view showing an example of the arrangement of the electrodes 112 arranged on the semiconductor substrate 110. As described above, in the radiation detector 100, a plurality of pixels 115 are arranged on the semiconductor substrate 110. The pixels 115 arranged on the semiconductor substrate 110 correspond to one pixel in a radiation image generated using the radiation detector 100. As shown in FIG. 2, in the radiation detector 100, the pixels 115 include the electrodes 112 of different sizes, respectively. More specifically, the plurality of pixels 115 include pixels 115a arranged along the outer edge of the semiconductor substrate 110 and pixels 115b arranged closer to the center of the semiconductor substrate 110 than the pixels 115a. Each pixel 115a includes a plurality of electrodes 112a and each pixel 115b includes an electrode 112b. In this case, the area of the electrode 112b is larger than the area of each of the plurality of electrodes 112a.

In the end portion of the semiconductor substrate 110, defects may occur due to machining in a dicing step when cutting out the semiconductor substrate 110, thereby decreasing the carrier transport property. Consequently, a signal output from each pixel 115a arranged along the outer edge of the semiconductor substrate 110 may have lower signal strength, as compared with the pixels 115b arranged closer to the center of the semiconductor substrate 110 than the pixels 115a, even if the doses of incident radiation are equal to each other. As a result, the image quality of the radiation image obtained by the radiation detector 100 may deteriorate. In this embodiment, to suppress the influence of the decrease in the carrier transport property in the end portion of the semiconductor substrate 110, the area of each electrode 112a arranged in each pixel 115a is smaller than the area of the electrode 112b arranged in each pixel 115b. The reason why the area of each electrode 112a arranged in each pixel 115a is made small will be described next.

In the radiation detector 100, as described above, the carrier transport property (mobility $\mu$ and lifetime $\tau$) decreases in the end portion (outer edge portion) of the semiconductor substrate 110 that converts radiation into charges. In many semiconductor materials, with respect to the $\mu\tau$-product representing the carrier transport property, the electron $\mu\tau$-product is larger than the hole $\mu\tau$-product. Thus, a decrease in hole collection efficiency is conspicuous, thereby decreasing the signal strength in the end portion of the semiconductor substrate 110. To cope with this, it is necessary to decrease the contribution ratio of the hole to the signal in the end portion of the semiconductor substrate 110, and suppress a decrease in the signal strength caused by the decrease in the hole collection efficiency.

Figure 6A:
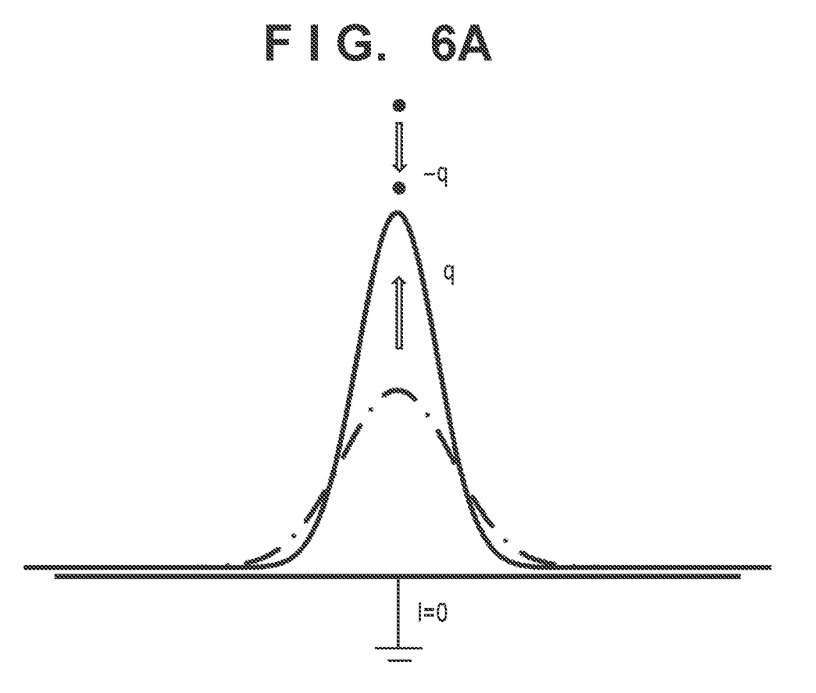
FIGS. 6A and 6B are graphs each showing a charge distribution induced on a conductor by a point charge.
Figure 6B:
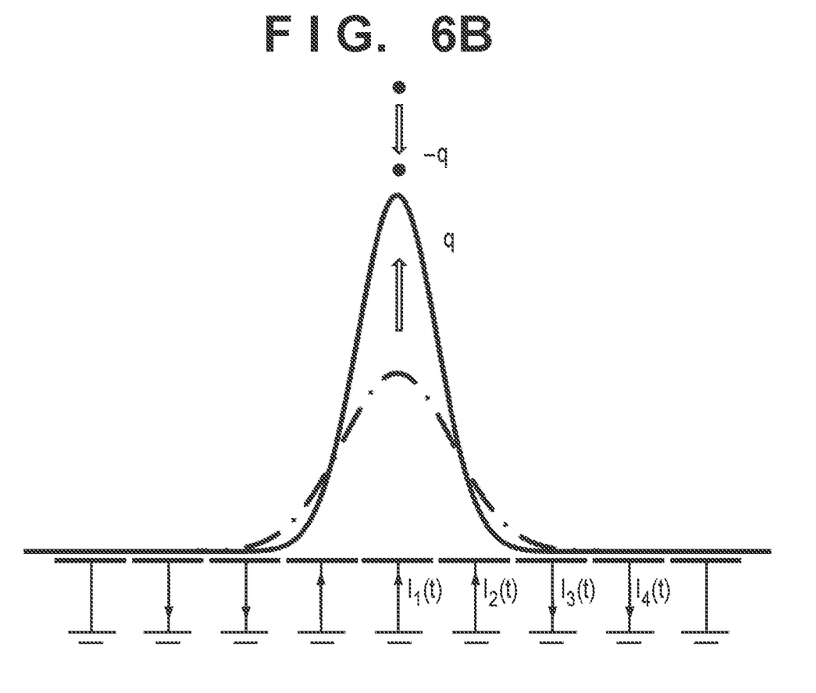

FIGS. 6A and 6B are graphs each showing a charge distribution induced on a conductor by a point cha7 excited on the semiconductor substrate 110 when radiation enters. FIG. 6A shows a case in which one continuous conductor (electrode) exists, and FIG. 6B shows a case in which segmented conductors (electrodes) exist. Each charge distribution induced by the point charge −q becomes narrower and steeper as the point charge −q moves closer to the conductor, as shown in each of FIGS. 6A and 6B. If the charge distribution shown in each of FIGS. 6A and 6B is integrated, a charge q induced on the conductor by the point charge −q is obtained. In this example, charges generated when radiation enters the semiconductor substrate 110 are electron-hole pairs but the holes are not illustrated in FIGS. 6A and 6B. A charge −q is induced on the conductor by the hole but the hole moves in a direction away from the conductor in each of FIGS. 6A and 6B. As a result, the induced charge −q is broadened, and the difference between the induced charge q and the induced charge −q generates a signal charge.

As shown in FIG. 6A, if the conductor is continuous, even if the position of the charge moves closer to the conductor, the charge induced on the conductor always remain q. On the other hand, as shown in FIG. 6B, if the conductor is segmented, the charge distribution induced by the point charge −q is the same as in FIG. 6A but an induced charge induced on each segmented conductor depends on the position of the point charge −q. That is, the induced charge of the segmented conductor changes along with movement of the point charge −q, and a current thus flows. Furthermore, if the point charge −q moves extremely close to the conductor, the induced charge −q is generated on the conductor immediately below the point charge −q. That is, by downsizing (segmenting) the conductor, the increase/decrease of the induced charge induced on the conductor changes depending on the position of the point charge. An apparent potential in consideration of this will be referred to as a weighting potential hereinafter.

Figure 7:
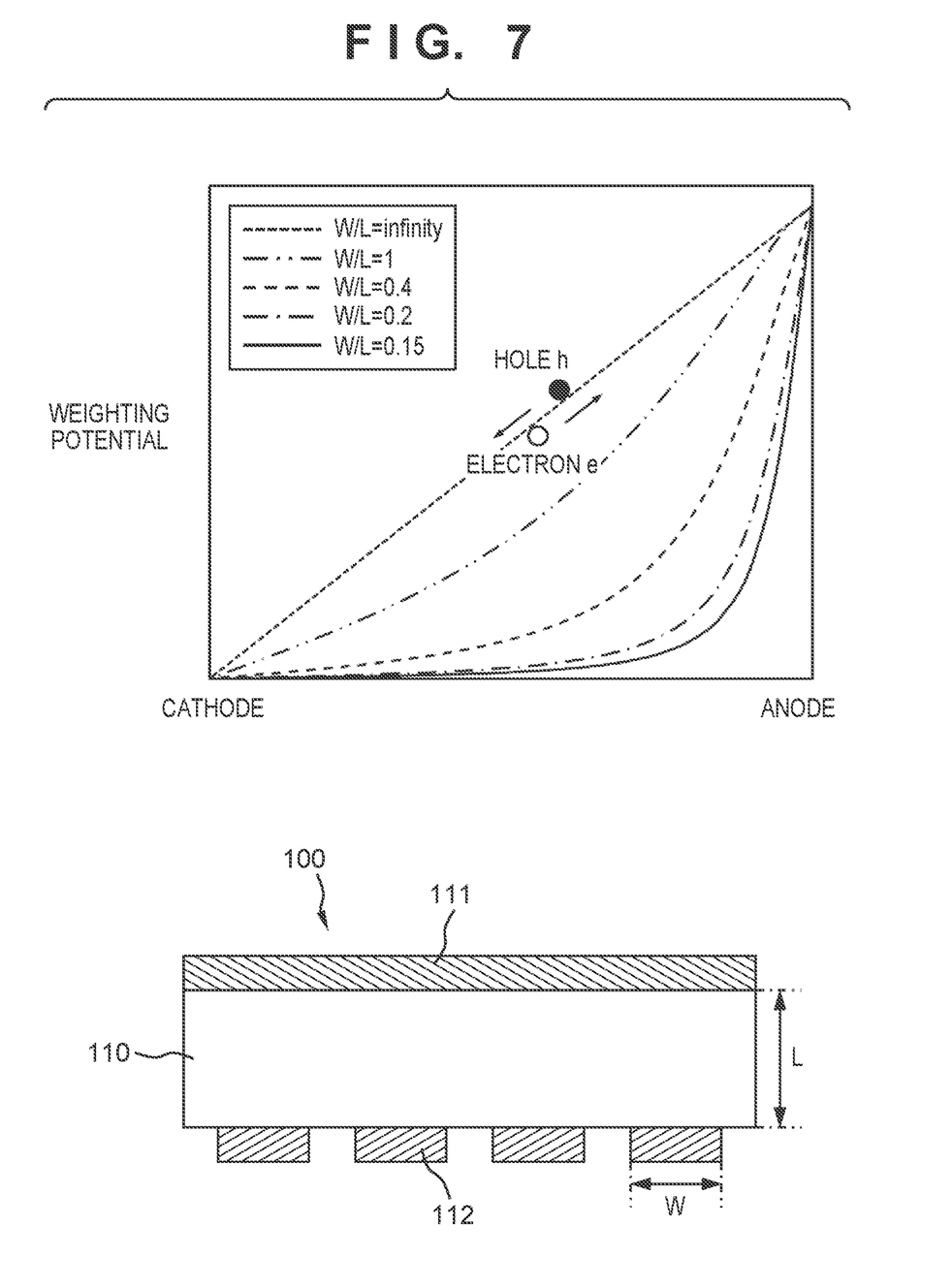
FIG. 7 is a view showing potential distributions when changing the width of the electrode and the thickness of the semiconductor substrate.

FIG. 7 shows weighting potential distributions when changing a width W of the electrode 112 and a thickness L of the semiconductor substrate 110. As described above, assume that to decrease the contribution ratio of the hole to the signal and obtain sufficient signal strength from the electron, the electrode 111 having the integrated structure functions as a cathode and the segmented electrodes 112 function as anodes. The weighting potential is decided based on the structure of the electrodes 112 and the thickness of the semiconductor substrate 110 regardless of a voltage applied between the electrodes 111 and 112 and the material of the semiconductor substrate 110. In addition, note that the weighting potential is a pseudo potential to calculate an induced charge, and is different from a potential (electric field) applied between the electrodes 111 and 112. The actual movement of the carrier is decided based on the potential (electric field) applied between the electrodes 111 and 112.

As shown in FIG. 7, if the electrode is continuous (indicated by infinity), the change of the potential between the cathode and the anode is constant. On the other hand, if the anode (electrode 112) is segmented and the W/L ratio becomes smaller, the change of the weighting potential becomes larger near the anode. The potential difference between the anode and the position at which the electron/hole is generated is a signal component to which the electron contributes, and the potential difference between the cathode and the position at which the electron/hole is generated is a signal component to which the hole contributes. As described above, with respect to the $\mu\tau$-product representing the carrier transport property, the electron $\mu\tau$-product is larger than the hole $\mu\tau$-product. Therefore, even if the electron is generated at a position away from the anode, it is collected by the anode. On the other hand, since the hole $\mu\tau$-product is small, the hole generated in a region close to the anode is difficult to be collected by the cathode. However, since the change of the potential with respect to the hole generated near the cathode is small, contribution of the hole to the signal strength is small. As a result, by decreasing the W/L ratio, it is possible to decrease the contribution ratio of the hole to the signal and obtain sufficient signal strength from the electron.

Therefore, in the end portion of the semiconductor substrate 110 where the carrier transport property decreases, to increase the induced charge generated by the electron, the area of each electrode 112a arranged in each pixel 115a arranged in the end portion of the semiconductor substrate 110 is made small, as shown in FIG. 2. This can suppress deterioration in image quality caused by a decrease in the carrier transport property in the end portion of the semiconductor substrate 110.

As shown in FIG. 2, each of the electrodes 112a and 112b may be square. In this case, the length (the width W shown in FIG. 7) of each side of each of the plurality of electrodes 112a arranged in each pixel 115a may be 0.2 times or less the thickness (the thickness L shown in FIG. 7) of the semiconductor substrate 110. As shown in FIG. 7, if the W/L ratio is equal to or smaller than 0.2, the inclination of the potential distribution is steep near the anode.

The plurality of pixels 115a may be arranged along the outer edge of the semiconductor substrate 110. For example, as shown in FIG. 2, the pixels 115a may be arranged along the outer edge of the semiconductor substrate 110 to surround the pixels 115b over one round. Referring to FIG. 2, the pixels 115a of one row are arranged to surround the pixels 115b. However, the pixels 115a of two or more rows may be arranged to surround the pixels 115b. In this case, the area of a region surrounded by a virtual line connecting the outer edges of the plurality of electrodes 112a arranged in each pixel 115a may be equal to the area of the electrode 112b arranged in each pixel 115b. As a result, the pixels 115 may be arranged at a constant pitch regardless of the pixels 115a and 115b. Thus, processing when generating a radiation image can become easier than in a case in which the pixels 115a and the pixels 115b are arranged at different pitches, respectively. The same applies to the arrangement of the electrodes 112 to be described below. However, the present invention is not limited to this, and the pitch at which the pixels 115a are arranged may be different from the pitch at which the pixels 115b are arranged. If each pixel 115 includes one electrode 112b like the pixel 115b, the pitch at which the pixels 115 are arranged may be defined as the interval between the geometric centroid positions of the electrodes 112b in orthogonal projection to the principal surface of the semiconductor substrate 110. Alternatively, if the pixel 115 includes the plurality of electrodes 112a like the pixel 115a, the pitch at which the pixels 115 are arranged may be defined as the interval between the geometric centroid positions of the regions each surrounded by the virtual line connecting the outer edges of the plurality of electrodes 112a arranged in each pixel 115a.

Figure 3:
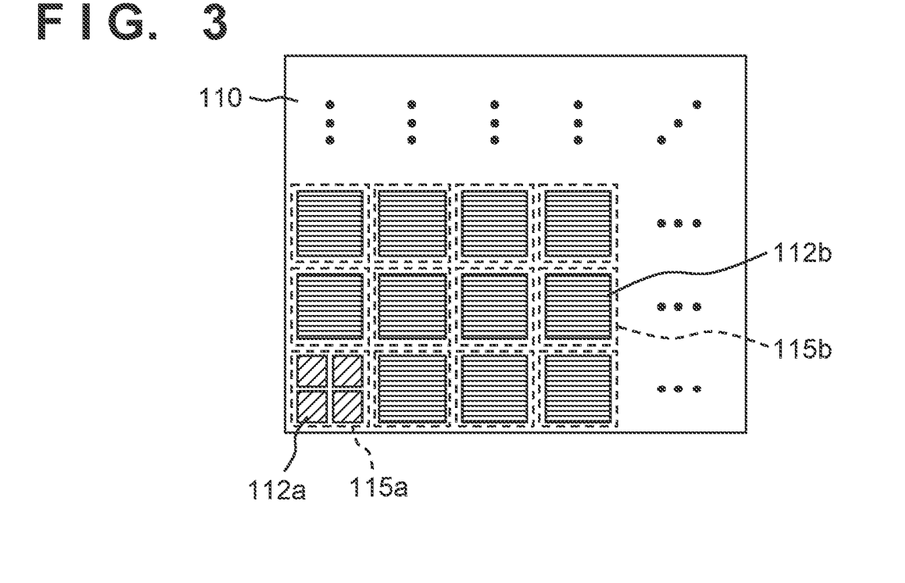
FIG. 3 is a view showing another example of the arrangement of electrodes arranged on the semiconductor substrate of the radiation detector shown in FIG. 1.

For example, as shown in FIG. 3, each electrode 112a of the pixel 115a arranged at a corner of the semiconductor substrate 110 may be smaller than the electrode 112b of another pixel 115b. That is, in orthogonal projection to the principal surface of the semiconductor substrate 110, the semiconductor substrate 110 has a rectangular shape, and the pixel 115a may be arranged at each end of the pixels 115 arranged along one side of the semiconductor substrate 110 among the plurality of pixels 115. Defects occurring when cutting out the semiconductor substrate 110 exist along the side of the semiconductor substrate 110, and the pixel 115 arranged at the corner of the semiconductor substrate 110 is influenced by the defects for two sides. Therefore, by decreasing the area of each electrode 112 of the pixel 115 arranged at the corner of the semiconductor substrate 110 and influenced most by the defects, it is possible to suppress the influence of the decrease in the carrier transport property.

Figure 4:
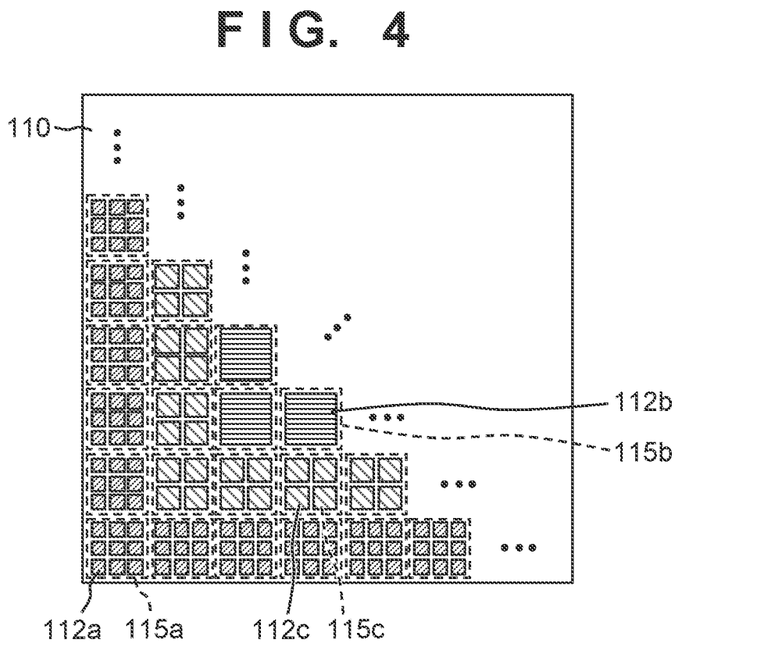
FIG. 4 is a view showing still another example of the arrangement of electrodes arranged on the semiconductor substrate of the radiation detector shown in FIG. 1.

In the arrangements shown in FIGS. 2 and 3, two kinds of electrodes 112 are arranged. The present invention, however, is not limited to them. The plurality of pixels 115 may include pixels 115c arranged between the pixels 115a and the pixels 115b, as shown in FIG. 4. Each pixel 115c includes a plurality of electrodes 112c, and the area of each of the plurality of electrodes 112c is larger than the area of each of the plurality of electrodes 112a of each pixel 115a and smaller than the area of the electrode 112b of each pixel 115b. That is, the area of the electrode 112 included in each pixel 115 may become smaller stepwise or continuously from the center of the semiconductor substrate 110 to its outer edge. In the example shown in FIG. 4, the electrodes 112 of three kinds of sizes are arranged. However, the electrodes 112 of four or more kinds of sizes may be arranged.

Figure 5:
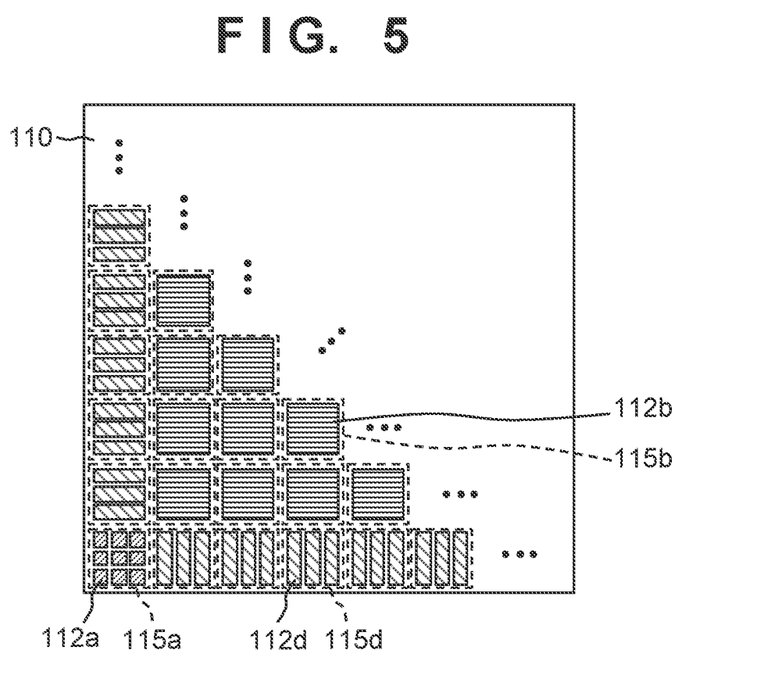
FIG. 5 is a view showing still another example of the arrangement of electrodes arranged on the semiconductor substrate of the radiation detector shown in FIG. 1.

FIG. 5 is a modification of the arrangement of the electrodes 112 shown in FIG. 3. Among the plurality of pixels 115, pixels 115d are arranged between the pixels 115a arranged at two ends of the pixels 115 arranged along one side of the semiconductor substrate 110. Each pixel 115d includes a plurality of electrodes 112d, and the area of each of the plurality of electrodes 112d is larger than the area of each of the plurality of electrodes 112a included in each pixel 115a and smaller than the area of the electrode 112b of each pixel 115b. That is, the pixels 115a and 115d in which the areas of the electrodes 112a and 112d are small, respectively, are arranged along the outer edge of the semiconductor substrate 110 to surround the pixels 115b arranged closer to the center of the semiconductor substrate 110 than the pixels 115a and 115d. By making the areas of the electrodes 112a and 112d of the pixels 115a and 115d along the outer edge of the semiconductor substrate 110 smaller than the area of the electrode 112b of each pixel 115b which is not arranged along the outer edge of the semiconductor substrate 110, the influence of the decrease in the carrier transport property in the end portion of the semiconductor substrate 110 is suppressed. Furthermore, since each pixel 115a arranged at the corner of the semiconductor substrate 110 is influenced by the defects for two sides, as described above, the area of each electrode 112a of each pixel 115a is made smaller than the area of each electrode 112d of each pixel 115d. This can further suppress deterioration in image quality of the radiation image caused by the decrease in the carrier transport property in the end portion of the semiconductor substrate 110.

In the arrangement shown in FIG. 5, the pixels 115a each including the nine electrodes 112a may be arranged along the outer edge of the semiconductor substrate 110 as in the arrangement shown in FIG. 3. In this case, the number of electrodes 112 arranged in one radiation detector 100 is very large. The segmented electrodes 112a need to be electrically independent of each other, as shown in FIG. 6B. Thus, if the number of electrodes 112 is large, the circuit scale of a readout circuit or the like unwantedly becomes large. If the electrodes of all the pixels are arranged as in the pixel 115a, the circuit scale of a readout circuit or the like also becomes large.

Figure 8A:
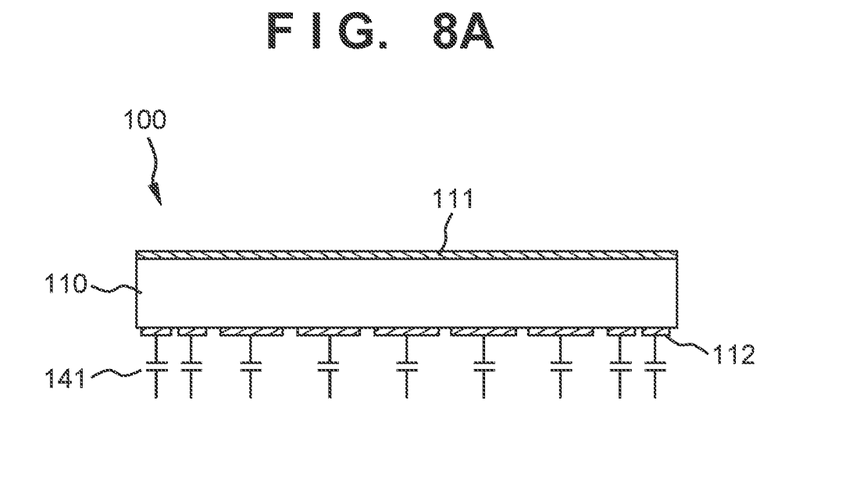
FIGS. 8A and 8B are views each showing an example of the arrangement of the radiation detector shown in FIG. 1.
Figure 8B:
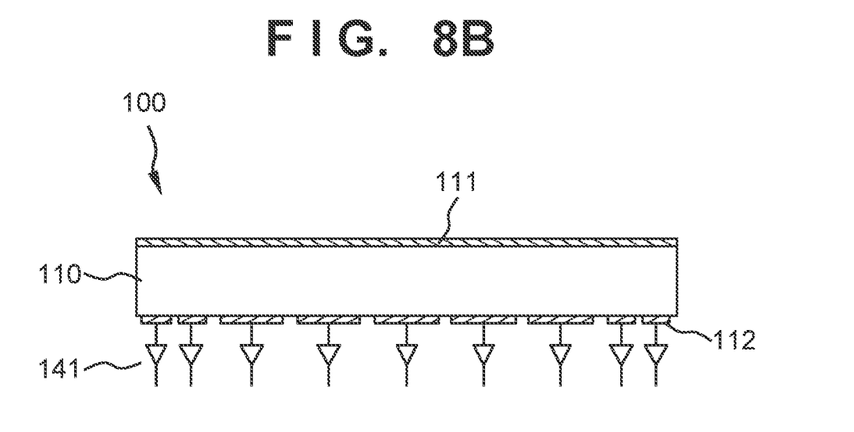

For example, as shown in FIG. 8A, a plurality of capacitors 141 for accumulating signals generated by the plurality of pixels 115 can be arranged in the radiation detector 100 so that one capacitor is connected in correspondence with each of all the electrodes 112. For example, as shown in FIG. 8B, a plurality of amplifiers 142 for amplifying the signals generated by the plurality of pixels 115 can be arranged in the radiation detector 100 so that one amplifier is connected in correspondence with each of all the electrodes 112. In this case, a shaper circuit, a discrimination circuit, and the like for discriminating a peak value to perform photon counting may be connected to the succeeding stage of the amplifier 142.

Therefore, as shown in FIG. 5, the pixels 115 along the outer edge of the semiconductor substrate 110 may be pixels having different numbers of electrodes 112 like the pixels 115a each including the nine electrodes 112a and the pixels 115d each including the three electrodes 112d. With the arrangement shown in FIG. 5, it is possible to suppress an increase in the circuit scale while suppressing the influence of the decrease in the carrier transport property in the end portion of the semiconductor substrate 110.

As shown in FIG. 5, each of the plurality of electrodes 112d may be rectangular. Each electrode 112a arranged in each pixel 115a may be rectangular. Similarly, the electrode 112b arranged in each pixel 115b may be rectangular. In this case, the short side of each of the plurality of electrodes 112d (electrodes 112a) may be arranged along the outer edge of the semiconductor substrate 110. Since defects can exist along the outer edge (side) of the semiconductor substrate 110, as described above, the effect of the above-described weighting potential distribution can be obtained by arranging the short side of each of the plurality of the electrode 112d along the outer edge of the semiconductor substrate 110. From the weighting potential distribution shown in FIG. 7, the length of the short side of each electrode 112d may be 0.2 times or less the thickness of the semiconductor substrate 110.

Figure 9A:
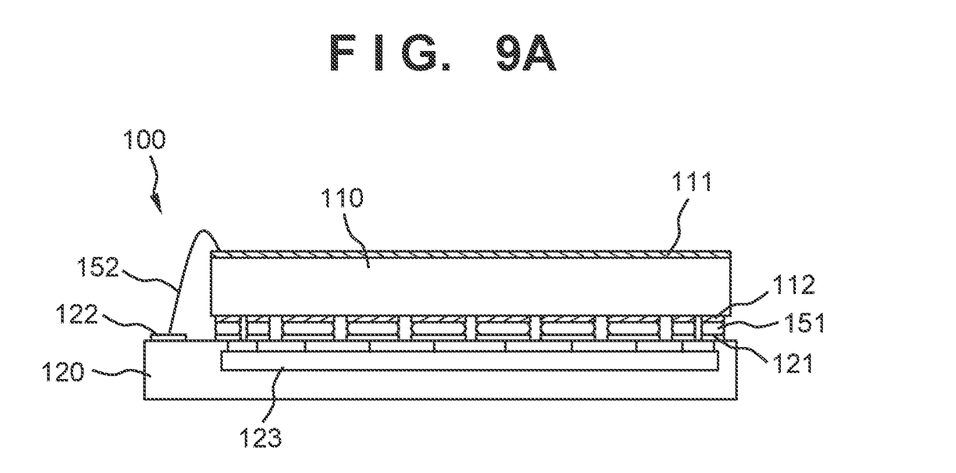
FIGS. 9A and 9B are views each showing an example of the arrangement of the radiation detector shown in FIG. 1.
Figure 9B:
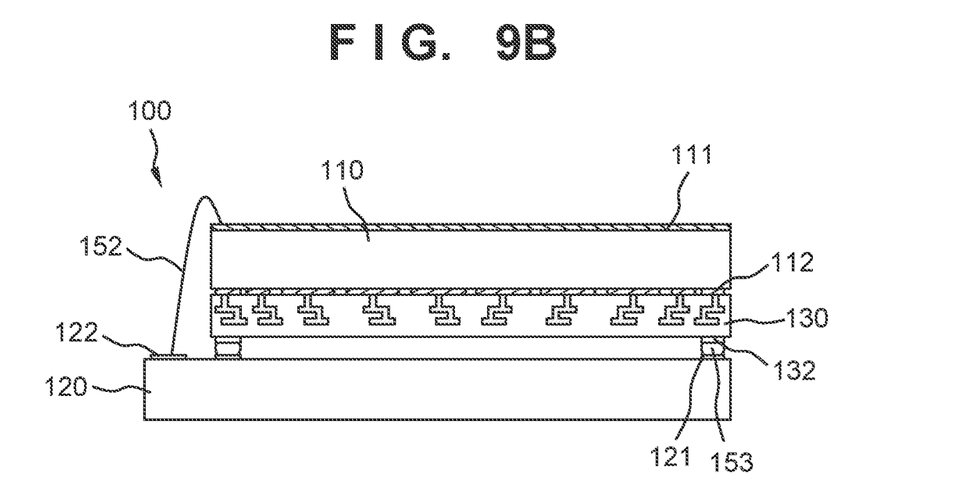

As shown in FIGS. 9A and 9B, the radiation detector 100 can include a mounting substrate 120. A surface, on which the electrodes 112 are provided, out of the two principal surfaces of the semiconductor substrate 110 faces the mounting substrate 120.

As shown in FIG. 9A, the electrodes 112 of the semiconductor substrate 110 may electrically be connected to terminals 121 of the mounting substrate 120 via bumps 151 such as solder balls. Furthermore, the electrode 111 of the semiconductor substrate 110 may electrically be connected to a terminal 122 of the mounting substrate 120 by a wire 152.

On the mounting substrate 120, the above-described capacitors 141 or amplifiers 142 can be arranged. Furthermore, on the mounting substrate 120, a signal generation unit 123 that generates a signal of one pixel (for example, the pixel 115a) based on the signal values of signals respectively read out from the plurality of electrodes 112 (for example, the electrodes 112a) provided in one pixel 115 (for example, the pixel 115a) may be arranged. Since, as described above, the electrodes 112 are electrically independent of each other, after the signals are read out, the signal values of the signals need to be added to obtain one signal as the signal of the pixel 115 including the plurality of electrodes 112.

For example, as shown in FIG. 9B, a readout circuit 130 for reading out a signal generated by the semiconductor substrate 110 may be arranged between the semiconductor substrate 110 and the mounting substrate 120. A terminal 132 of the readout circuit 130 may electrically be connected to the terminal 121 of the mounting substrate 120 via a bump 153 such as a solder ball. In this case, the above-described capacitors 141 or amplifiers 142 may be arranged in the readout circuit 130.

As described above, it is possible to implement the radiation detector 100 while suppressing the influence of the decrease in the carrier transport property in the end portion of the semiconductor substrate 110. As a result, it is possible to suppress deterioration in the image quality of the obtained radiation image.

Figure 10:
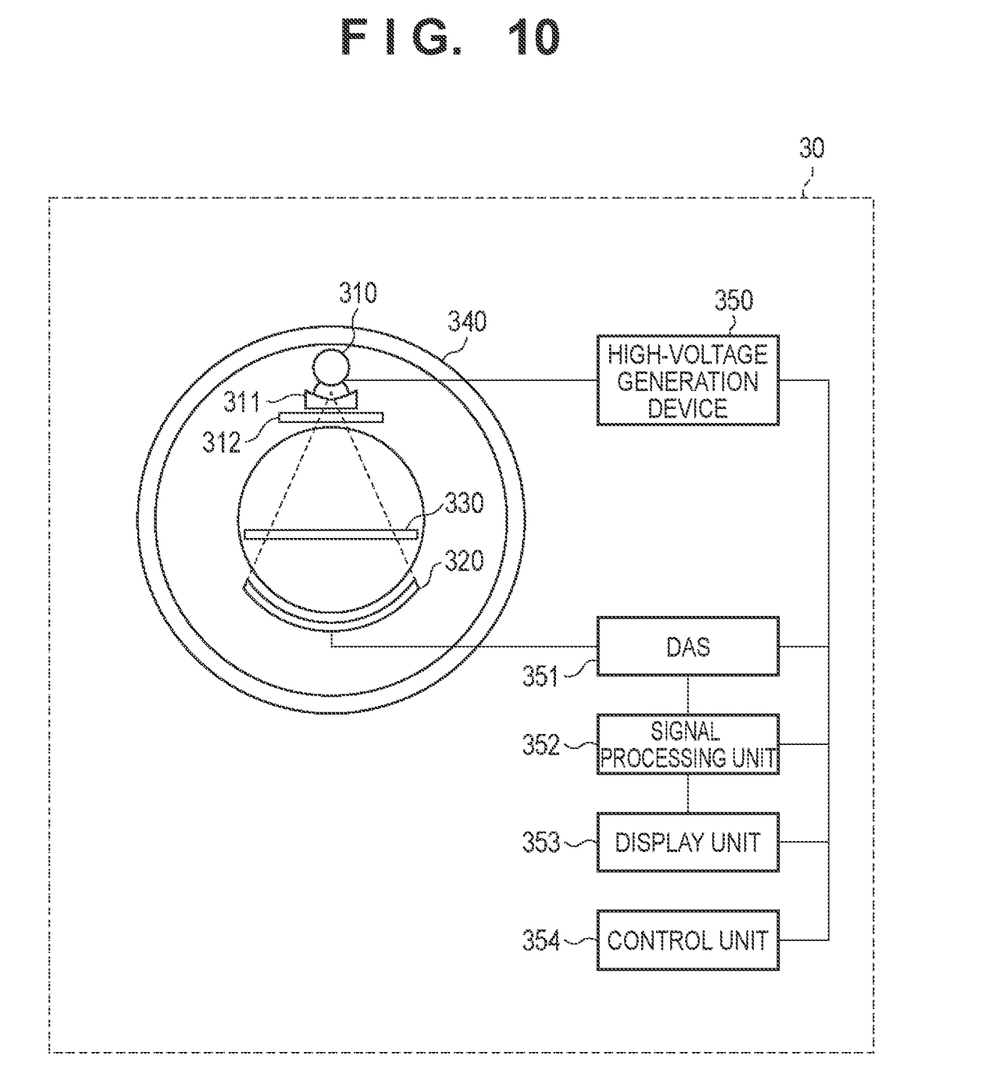
FIG. 10 is a view showing an example of the arrangement of a radiation CT apparatus using the radiation detector shown in FIG. 1.

FIG. 10 is a block diagram of a radiation CT apparatus according to this embodiment. The above-described radiation detector 100 is applicable to a detector of the radiation CT apparatus. A radiation CT apparatus 30 according to this embodiment includes a radiation generation unit 310, a wedge 311, a collimator 312, a radiation detection unit 320, a top plate 330, a rotating frame 340, a high-voltage generation device 350, a DAS (data acquisition system) 351, a signal processing unit 352, a display unit 353, and a control unit 354.

The radiation generation unit 310 is formed from, for example, a vacuum tube that generates X-rays. The vacuum tube of the radiation generation unit 310 is supplied with a filament current and a high voltage from the high-voltage generation device 350. When thermoelectrons are emitted from a cathode (filament) to an anode (target), X-rays are generated.

The wedge 311 is a filter that adjusts the amount of radiation emitted from the radiation generation unit 310. The wedge 311 attenuates the amount of radiation so that the radiation emitted from the radiation generation unit 310 to an object has a predetermined distribution. The collimator 312 is formed from a lead plate that narrows the irradiation range of the radiation having passed through the wedge 311. The radiation generated by the radiation generation unit 310 is formed in a cone beam shape via the collimator 312, and the object on the top plate 330 is irradiated with the radiation.

The radiation detection unit 320 is formed using the above-described radiation detector 100. The radiation detection unit 320 detects the radiation having passed through the object from the radiation generation unit 310, and outputs a signal corresponding to the amount of the radiation to the DAS 351.

The rotating frame 340 is annular, and is configured to be rotatable. The radiation generation unit 310 (the wedge 311 and the collimator 312) and the radiation detection unit 320 are arranged to face each other in the rotating frame 340. The radiation generation unit 310 and the radiation detection unit 320 can rotate together with the rotating frame 340.

The high-voltage generation device 350 includes a boosting circuit, and outputs a high voltage to the radiation generation unit 310. The DAS 351 includes an amplification circuit and an A/D conversion circuit, and outputs, as digital data, a signal from the radiation detection unit 320 to the signal processing unit 352.

The signal processing unit 352 includes a CPU (Central Processing Unit), a ROM (Read Only Memory), and a RAM (Random Access Memory), and can execute image processing and the like for the digital data. The display unit 353 includes a flat display device, and can display a radiation image. The control unit 354 includes a CPU, a ROM, and a RAM, and controls the operation of the overall radiation CT apparatus 30.

According to the present invention, there can be provided a technique advantageous in suppressing the influence of a decrease in the carrier transport property in the end portion of the semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-034931, filed Mar. 7, 2023, which is hereby incorporated by reference herein in its entirety.

What is claimed is:

1. A radiation detector obtained by arranging a plurality of pixels on a semiconductor substrate configured to convert incident radiation into charges, wherein
the plurality of pixels comprise a first pixel arranged along an outer edge of the semiconductor substrate and a second pixel arranged closer to a center of the semiconductor substrate than the first pixel,
the first pixel comprises a plurality of first electrodes on one principal surface out of two principal surfaces of the semiconductor substrate,
the second pixel comprises a second electrode on the one principal surface, an area of the second electrode is larger than an area of each of the plurality of first electrodes, and a plurality of capacitors configured to accumulate signals generated by the plurality of pixels are further comprised so that one capacitor is connected in correspondence with each of the plurality of first electrodes and the second electrode.

2. The detector according to claim 1, wherein each of the plurality of first electrodes is square.

3. The detector according to claim 2, wherein a length of a side of each of the plurality of first electrodes is not larger than 0.2 times a thickness of the semiconductor substrate.

4. The detector according to claim 1, wherein each of the plurality of first electrodes is rectangular.

5. The detector according to claim 4, wherein a length of a short side of each of the plurality of first electrodes is not larger than 0.2 times a thickness of the semiconductor substrate.

6. The detector according to claim 4, wherein a short side of each of the plurality of first electrodes is arranged along the outer edge of the semiconductor substrate.

7. The detector according to claim 1, wherein an area of a region surrounded by a virtual line connecting outer edges of the plurality of first electrodes is equal to the area of the second electrode.

8. The detector according to claim 1, wherein the plurality of pixels comprise a third pixel arranged between the first pixel and the second pixel, the third pixel comprises a plurality of third electrodes on the one principal surface, and an area of each of the plurality of third electrodes is larger than the area of each of the plurality of first electrodes and smaller than the area of the second electrode.

9. The detector according to claim 8, wherein the plurality of third electrodes function as anodes.

10. The detector according to claim 1, wherein the plurality of first pixels are arranged along the outer edge of the semiconductor substrate.

11. The detector according to claim 1, wherein in orthogonal projection to the principal surface, the semiconductor substrate has a rectangular shape, and the first pixel is arranged at each end of the pixels arranged along one side of the semiconductor substrate among the plurality of pixels.

12. The detector according to claim 11, wherein among the plurality of pixels, a fourth pixel is arranged between the first pixels arranged at the two ends of the pixels arranged along the one side, the fourth pixel comprises a plurality of fourth electrodes on the one principal surface, and an area of each of the plurality of fourth electrodes is larger than the area of each of the plurality of first electrodes and smaller than the area of the second electrode.

13. The detector according to claim 12, wherein the plurality of fourth electrodes function as anodes.

14. The detector according to claim 1, wherein the plurality of first electrodes and the second electrode function as anodes.

15. The detector according to claim 1, further comprising a plurality of amplifiers configured to amplify signals generated by the plurality of pixels so that one amplifier is connected in correspondence with each of the plurality of first electrodes and the second electrode.

16. The detector according to claim 1, further comprising a signal generator configured to generate a signal of the first pixel based on signal values of signals respectively read out from the plurality of first electrodes.

17. The detector according to claim 1, wherein the semiconductor substrate is a single crystal substrate made of cadmium zinc telluride.

18. The detector according to claim 1, wherein the semiconductor substrate is a single crystal substrate made of one of cadmium telluride, lead iodide, mercury iodide, bismuth iodide, and thallium bromide.

19. The detector according to claim 1, wherein the plurality of pixels are arranged at a constant pitch.

20. A radiation CT apparatus comprising:

the radiation detector according to claim 1;

a radiation generator configured to irradiate the radiation detector with radiation; and a signal processor configured to process a signal output from the radiation detector.

\* \* \* \* \*